(12) United States Patent
Miyatsu

(10) Patent No.: US 10,264,702 B2
(45) Date of Patent: Apr. 16, 2019

(54) KVM SWITCH, MOUNTING BRACKET AND SYSTEM

(71) Applicant: FUJITSU COMPONENT LIMITED, Tokyo (JP)

(72) Inventor: Keiji Miyatsu, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 16/031,156

(22) Filed: Jul. 10, 2018

(65) Prior Publication Data

US 2018/0324972 A1 Nov. 8, 2018

Related U.S. Application Data

(62) Division of application No. 15/523,185, filed as application No. PCT/JP2015/075175 on Sep. 4, 2015, now Pat. No. 10,051,760.

(30) Foreign Application Priority Data

Oct. 30, 2014 (JP) .................................. 2014-221960

(51) Int. Cl.
| | |
|---|---|
| *H05K 7/14* | (2006.01) |
| *G06F 1/16* | (2006.01) |
| *G06F 1/18* | (2006.01) |
| *H05K 7/18* | (2006.01) |

(52) U.S. Cl.
CPC .......... *H05K 7/1491* (2013.01); *G06F 1/16* (2013.01); *G06F 1/18* (2013.01); *H05K 7/1494* (2013.01); *H05K 7/18* (2013.01); *H05K 7/183* (2013.01)

(58) Field of Classification Search
CPC .......................... H05K 7/1491; H05K 7/1494
See application file for complete search history.

(56) References Cited

U.S. PATENT DOCUMENTS

| | | | |
|---|---|---|---|
| 5,808,876 A | 9/1998 | Mullenbach et al. | |
| 6,142,590 A * | 11/2000 | Harwell .................... | G06F 1/16 312/208.1 |
| 6,442,030 B1* | 8/2002 | Mammoser ........... | G06F 1/1601 248/917 |
| 6,442,031 B1* | 8/2002 | Liu ...................... | H05K 7/1421 312/334.1 |
| 6,621,692 B1 | 9/2003 | Johnson et al. | |
| 6,805,248 B2 | 10/2004 | Champion et al. | |

(Continued)

FOREIGN PATENT DOCUMENTS

| | | |
|---|---|---|
| DE | 202007002614 | 5/2007 |
| JP | 2002-336060 | 11/2002 |
| JP | 2006-185419 | 7/2006 |
| JP | 2006-302245 | 11/2006 |
| JP | 2007-183735 | 7/2007 |

(Continued)

OTHER PUBLICATIONS

International Search Report for PCT/JP2015/075175, dated Dec. 8, 2015.

(Continued)

*Primary Examiner* — Adrian S Wilson
(74) *Attorney, Agent, or Firm* — Staas & Halsey LLP

(57) ABSTRACT

A body part of a KVM (Keyboard, Video, Mouse) switch includes a clamp that holds a cable and is movable in a horizontal direction, and a stay that is equipped with the cable clamp and is movable in a depth direction of the body part to eliminate the cable hanging down.

6 Claims, 17 Drawing Sheets

(56) References Cited

U.S. PATENT DOCUMENTS

| | | | | |
|---|---|---|---|---|
| 6,854,605 | B2* | 2/2005 | Wrycraft | H05K 7/1491 211/187 |
| 6,867,980 | B2* | 3/2005 | Wrycraft | H05K 7/1491 174/68.3 |
| 6,891,727 | B2* | 5/2005 | Dittus | G06F 1/183 211/26 |
| 6,945,412 | B2* | 9/2005 | Felcman | H05K 7/1494 211/175 |
| 7,187,554 | B2* | 3/2007 | Seki | A47B 21/0314 361/727 |
| 7,808,795 | B2* | 10/2010 | Lu | H05K 7/1491 312/223.1 |
| 8,387,933 | B2* | 3/2013 | Yu | H05K 7/1491 211/26 |
| 2005/0145582 | A1* | 7/2005 | Dubon | H02G 3/128 211/26 |
| 2006/0117085 | A1 | 6/2006 | Nagao et al. | |
| 2006/0220505 | A1* | 10/2006 | Nakamura | G06F 1/16 312/223.2 |
| 2006/0232917 | A1* | 10/2006 | Wu | G06F 1/16 361/679.01 |
| 2008/0284300 | A1* | 11/2008 | Wu | G06F 1/182 312/334.1 |
| 2010/0057842 | A1* | 3/2010 | Priller | G06F 1/183 709/203 |
| 2012/0001034 | A1* | 1/2012 | Iizuka | H05K 7/1489 248/73 |
| 2013/0077219 | A1 | 3/2013 | Fu et al. | |

FOREIGN PATENT DOCUMENTS

| | | |
|---|---|---|
| JP | 2007-323187 | 12/2007 |
| JP | 2012-015281 | 1/2012 |
| WO | 2011/006293 | 1/2011 |

OTHER PUBLICATIONS

J-Plat Pat English Abstract of JP 2006-302245, published Nov. 2, 2006.
J-Plat Pat English Abstract of JP 2012-015281, published Jan. 19, 2012.
J-Plat Pat English Abstract of JP 2007-183735, published Jul. 19, 2007.
J-Plat Pat English Abstract of JP 2006-185419, published Jul. 13, 2006.
J-Plat Pat English Abstract of JP 2002-336060, published Nov. 26, 2002.
J-Plat Pat English Abstract of JP 2007-323187, published Dec. 13, 2007.
Partial Supplementary European Search Report for European Patent Application No. 15855479.0, dated May 18, 2018.
Espacenet English Abstract for German Patent Application Publication No. 202007002614, published Apr. 26, 2007.
Office Action for U.S. Appl. No. 15/523,185, dated Dec. 26, 2017.
Notice of Allowance for U.S. Appl. No. 15/523,185, dated Jun. 1, 2018.
Supplemental Notice of Allowability for U.S. Appl. No. 15/523,185, dated Jun. 26, 2018.

* cited by examiner

KVM SWITCH, MOUNTING BRACKET AND SYSTEM

CROSS REFERENCE TO RELATED APPLICATIONS

This application is a divisional of U.S. patent application Ser. No. 15/523,185, filed on Apr. 28, 2017, which is a U.S. National Stage Application, which claims the benefit under 35 U.S.C. § 371 of PCT International Patent Application No. PCT/JP2015/075175, filed Sep. 4, 2015, which claims the foreign priority benefit under 35 U.S.C. § 119 of Japanese Patent Application No. 2014-221960, filed Oct. 30, 2014.

TECHNICAL FIELD

The present invention relates to a KVM (keyboard, video, mouse) switch, a mounting bracket and a system.

BACKGROUND ART

FIG. 1. is a diagram illustrating the configuration of a KVM switch mountable on a server rack. The KVM switch includes a body part 1 that is fixed to rear support posts 5 and performs switching of a server, and a switch unit 2 that is fixed to front support posts 4 and includes a server-switching switch. The switch unit 2 is separated from the body part 1 and is connected to the body part 1 via a cable 3. When a server-switching instruction is input to the switch unit 2, the body part 1 performs the switching of the server depending on the server-switching instruction.

Moreover, there have been conventionally known a display and a keyboard module (i.e., a console drawer) and a KVM switch which are housed in a server rack (e.g. see Patent Document 1).

FIG. 2 is a diagram illustrating a state where a console drawer 7 and a KVM switch 6 are housed in a server rack. Here, guide rails 9 are mounted on both side faces of the console drawer 7. Screw holes (not shown) for screwing are formed on each of the guide rails 9. Brackets 8 for mounting the KVM switch 6 on support posts 10 are provided on both side faces of the KVM switch 6. Screw holes 8a for screwing are formed on each of the brackets 8. Screws 12 are fastened to the screw holes 8a of each brackets 8 and screw holes (not shown) of each guide rail 9 via through-holes 11 of the support posts 10. Thereby, the console drawer 7 and the KVM switch 6 are fixed to the support posts 10.

Thus, when the console drawer 7 and the KVM switch 6 are housed in the server rack, the guide rails 9 mounted on the console drawer 7 and the brackets 8 mounted on the KVM switch 6 need to be screwed to the support posts 10 together. Therefore, one worker supports the console drawer 7 and another worker performs screw fixing while supporting the KVM switch 6.

PRIOR ART DOCUMENT

[Patent Document 1] Japanese Laid-open Patent Publication No. 2006-302245

Meanwhile, in FIG. 1, the switch unit 2 is connected to the body part 1 via the cable 3. However, the cable 3 hangs down between the switch unit 2 and the body part 1, and hence there is a problem that the cable 3 comes into a lower part of the server rack and is caught on a device of the lower part.

Moreover, when the console drawer 7 and the KVM switch 6 are housed in the server rack as illustrated in FIG. 2, the one worker supports the console drawer 7 and the another worker performs the screw fixing while supporting the KVM switch 6. Therefore, there is a problem that the console drawer and the KVM switch cannot be mounted on the server rack by only one worker.

SUMMARY OF THE INVENTION

It is an object of the present invention to provide a KVM switch that can eliminate hanging-down of a cable. It is another object of the present invention to provide a mounting bracket and a system that facilitates mounting a plural of devices on a server rack.

To achieve the above-mentioned object, a KVM (K: keyboard, V: Video, M: Mouse) switch that is mounted on a server rack, disclosed herein including: a switch unit that includes a server-switching switch and is fixed to front support posts of the server rack; and a body part that is fixed to rear support posts of the server rack, is connected to the switch unit via a cable, and switches a server depending on a server-switching instruction from the switch unit; wherein the body part includes: a holding part that holds the cable and is movable in a horizontal direction; and a moving part that slides in a depth direction of the body part.

To achieve the above-mentioned object, a mounting bracket for mounting a second device electrically connected to a first device on right and left support posts of a rack along with right and left guide rails on which the first device is mounted, the mounting bracket disclosed herein including: a right mounting part that includes a first screw hole, is fastened to the right support post along with the right guide rail via the first screw hole with the use of a first screw, and has a shape not to contact a third screw that fastens the right guide rail to the right support post; and a left mounting part that includes a second screw hole, is fastened to the left support post along with the left guide rail via the second screw hole with the use of a second screw, and has a shape not to contact a fourth screw that fastens the left guide rail to the left support post.

To achieve the above-mentioned object, a system disclosed herein including: a rack; a pair of guide rails that are screwed to a front face and a rear face of the rack with a plurality of screws; an electronic device mounted on the front face and the rear face of the rack; a mounting bracket that mounts the electronic device on the rack; wherein the mounting bracket includes: a first mounting part that includes a first screw hole for screwing the electronic device to one of a right side and a left side of the rack with a first screw, and a first cutout that is formed at a position of a second screw fixing one of the guide rails to the one of the right side and the left side of the rack; a second mounting part that includes a second screw hole for screwing the electronic device to the other of the right side and the left side of the rack with a third screw, and a second cutout that is formed at a position of a fourth screw fixing the other of the guide rails to the other of the right side and the left side of the rack; wherein the electronic device is fixed to the rack along with the guide rails with the first screws and the third screws.

According to the present invention, it is possible to eliminate hanging-down of the cable. Moreover, according to the present invention, even one worker can mount the plural of devices on the server rack.

DETAILED DESCRIPTION

Hereinafter, a description will be given of embodiments of the present invention with reference to drawings.

First Embodiment

Figure 1:
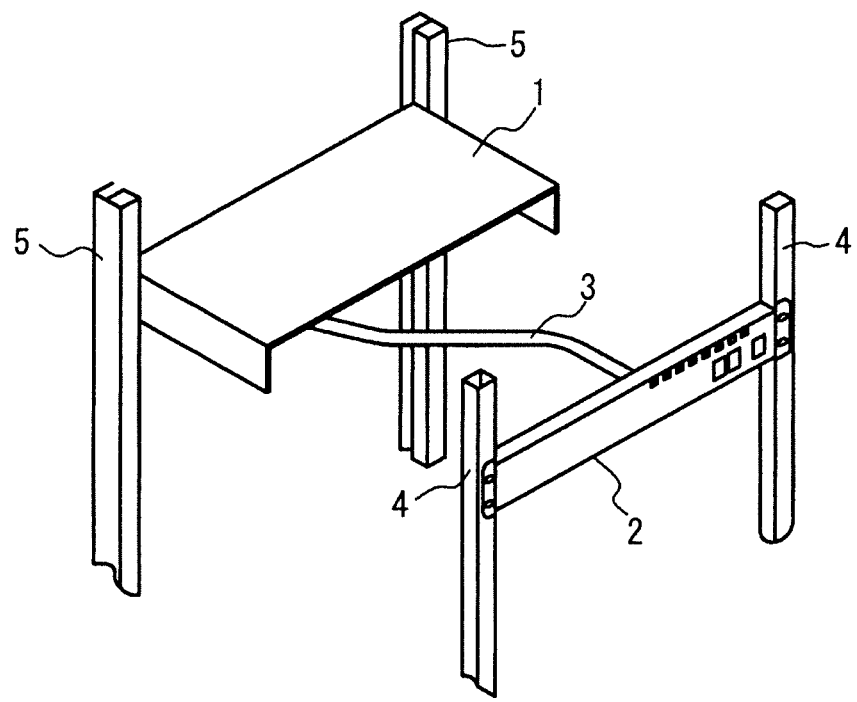
FIG. 1 is a diagram illustrating the configuration of a KVM switch mountable on a server rack.
Figure 2:
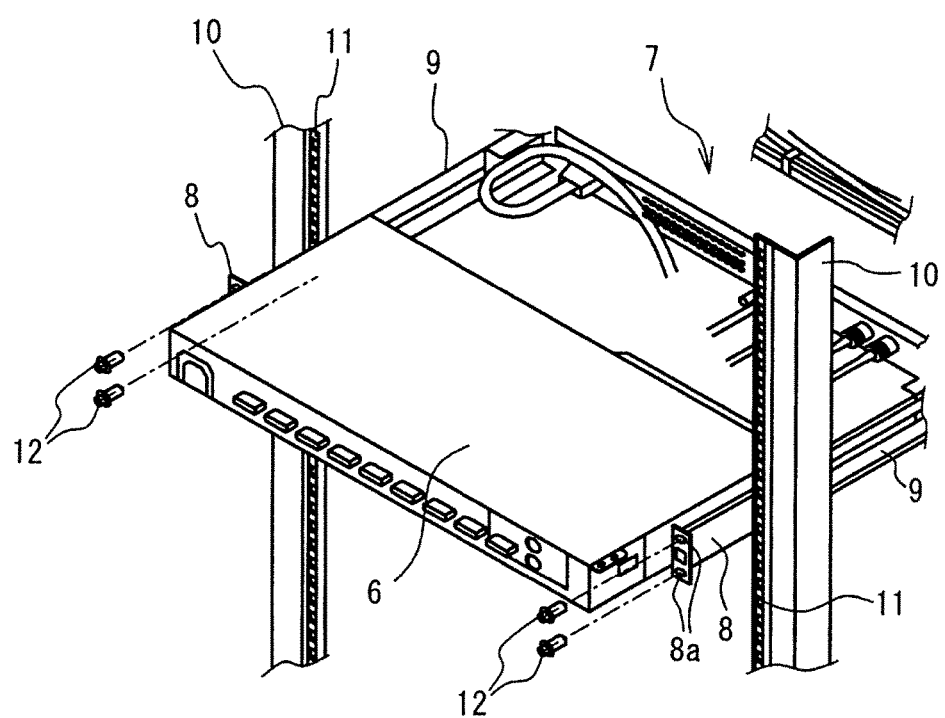
FIG. 2 is a diagram illustrating a state where a console drawer and the KVM switch are housed in the server rack.
Figure 3:
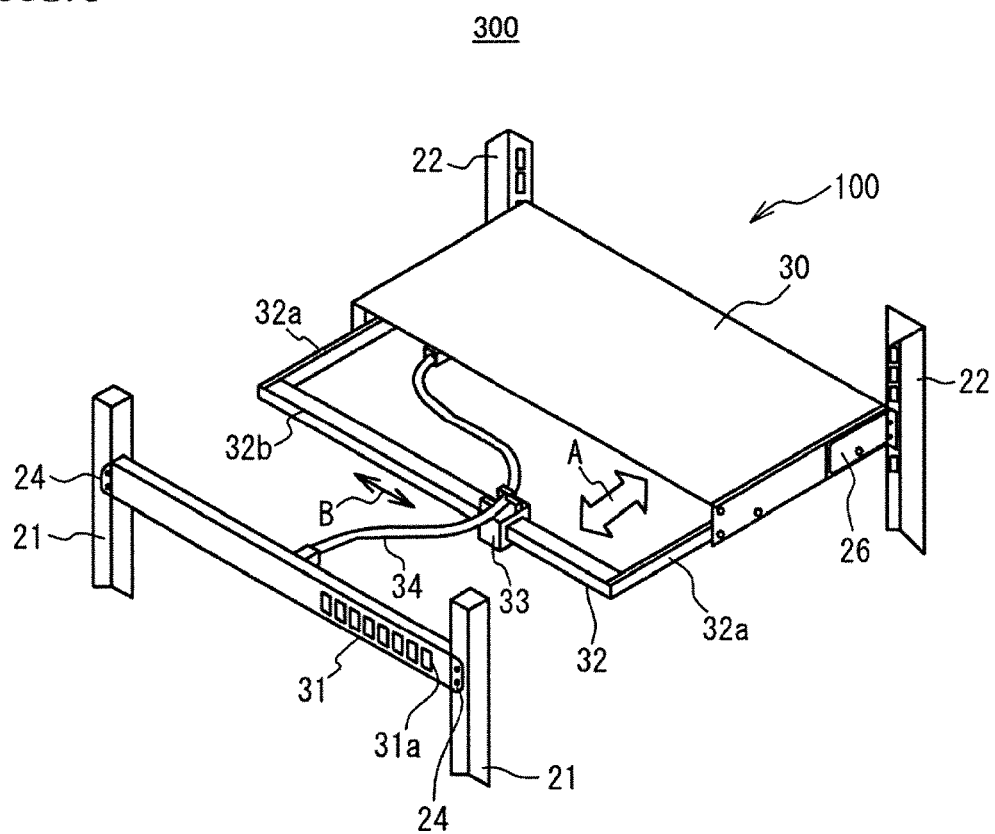
FIG. 3 is a perspective view of the KVM switch according to a first embodiment.
Figure 4:
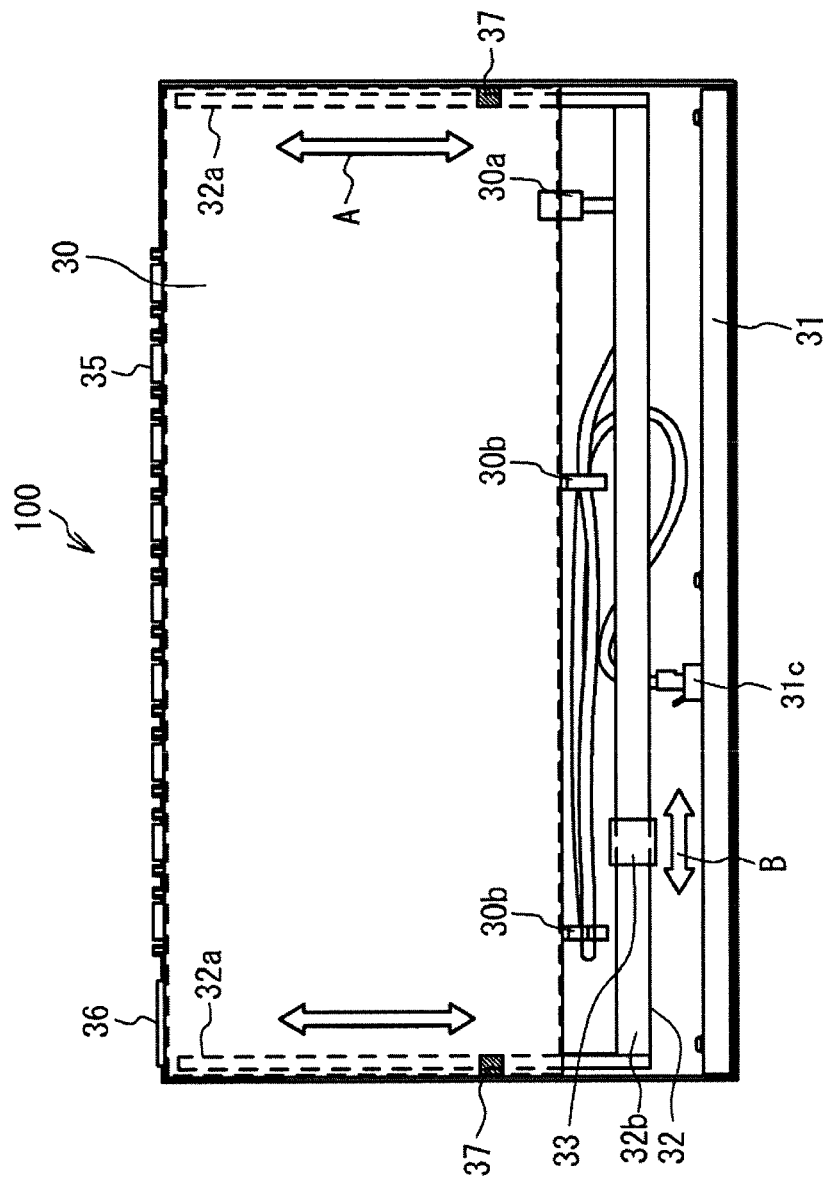
FIG. 4 is a diagram illustrating the internal configuration of the KVM switch seen from above.
Figure 5:
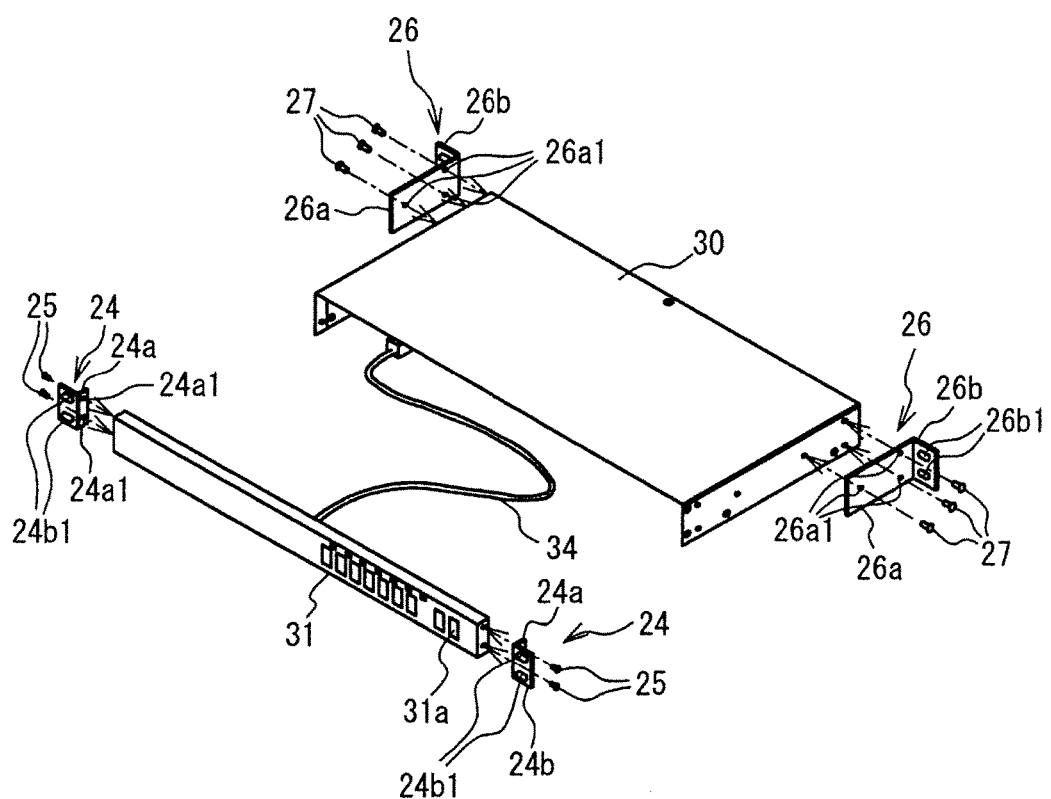
FIG. 5 is a diagram illustrating mounting brackets for mounting the KVM switch on front support posts and rear support posts of the server rack.

FIG. 3 is a perspective view of the KVM switch according to a first embodiment. FIG. 4 is a diagram illustrating the internal configuration of the KVM switch seen from above. FIG. 5 is a diagram illustrating mounting brackets for mounting the KVM switch on front support posts and rear support posts of the server rack.

In FIG. 3, a KVM switch 100 includes: a body part 30 that is mounted on rear support posts 22 of a server rack 300, and switches a server to be operated; and a switch unit 31 that is mounted on front support posts 21 of the server rack 300, and includes a server-switching switch 31a. The switch unit 31 is separable from the body part 30, and is connected to the body part 30 via a cable 34. When a server-switching instruction is input by depression of the server-switching switch 31a of the switch unit 31, the body part 30 switches a server to be operated to an instructed server (not shown).

As illustrated in FIG. 5, mounting brackets 24 for attaching to the front support posts 21 are fastened to the both side faces of the switch unit 31 with screws 25. In FIG. 5, each mounting bracket 24 is bent in an L-shape in a top view, and includes: a first mounting part 24a that is opposite to the side face of the switch unit 31; and a second mounting part 24b that is bent at 90 degrees from the first mounting part 24a and is mounted on the front support posts 21 of the server rack. Moreover, screw holes 24a1 for screwing the mounting bracket 24 to the side face of the switch unit 31 are formed in the first mounting part 24a. Screw holes 24b1 for screwing the mounting bracket 24 to the front support posts 21 of the server rack are formed in the second mounting part 24b.

Moreover, as illustrated in FIG. 5, mounting brackets 26 for attaching to the rear support posts 22 of the server rack are fastened to the both side faces of the body part 30 with screws 27. In FIG. 5, each mounting bracket 26 is bent in the L-shape in the top view, and includes: a first mounting part 26a that is opposite to the side face of the body part 30; and a second mounting part 26b that is bent at 90 degrees from the first mounting part 26a and is mounted on the rear support posts 22 of the server rack. Moreover, screw holes 26a1 for screwing the mounting bracket 26 to the side face of the body part 30 are formed in the first mounting part 26a. Screw holes 26b1 for screwing the mounting bracket 26 to the rear support posts 22 of the server rack are formed in the second mounting part 26b.

The body part 30 incorporates a cable stay 32 (a moving part) supporting the cable 34, as illustrated in FIG. 4. The cable stay 32 has a U-shape in the top view, and includes a pair of arm parts 32a (a first arm part) extending in parallel with both side faces of the body part 30, and a rod-like coupling part 32b coupled with front ends of the arm parts 32a. When the switch unit 31 is housed in the body part 30, the coupling part 32b is placed in parallel with the switch unit 31. The cable stay 32 is slidable in an A-direction of FIG. 4 (i.e., a depth direction of the body part 30). A cable clamp 33 (a holding part) holding the cable 34 is provided on the coupling part 32b of the cable stay 32. The cable clamp 33 is slidable in a B-direction of FIG. 4 (i.e., a horizontal direction).

As illustrated in FIG. 4, the switch unit 31 includes a port 31c for connecting the cable 34, and the body part 30 includes a port 30a for connecting the cable 34. The body part 30 includes a holding part 30b holding the cable 34. Moreover, a plurality of serial ports 35 for connecting servers, not shown, and a power supply feeding port 36 to which a power supply cable, not shown, is connected are provided on a rear face of the body part 30. The body part 30 includes a damper 37 (a moving stopper) stopping the slide of the cable stay 32 at an optimum position.

Figure 6:
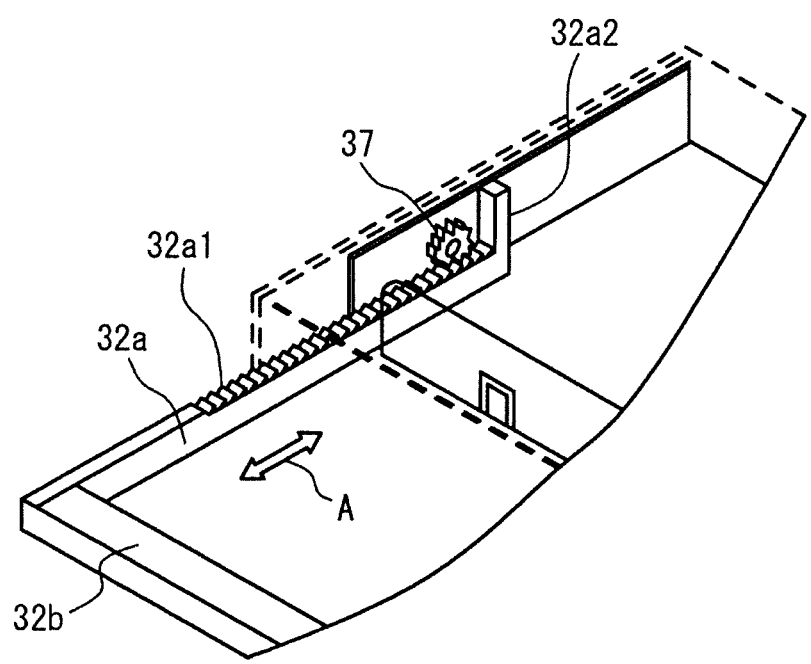
FIG. 6 is a diagram illustrating a sliding mechanism of a cable stay.

FIG. 6 is a diagram illustrating a sliding mechanism of the cable stay 32.

In FIG. 6, the sliding mechanism of the cable stay 32 includes the arm parts 32a of the cable stay 32 and the damper 37. The damper 37 is formed in a gear shape, and an uneven part 32a1 which engages with the damper 37 is formed on an upper face of the arm part 32a of the cable stay 32. Moreover, a stopper 32a2 which stops drawing out the cable stay 32 by contacting the damper 37 is formed at a rear end of the arm part 32a of the cable stay 32. The cable stay 32 slides in a depth direction (an A-direction). The damper 37 engages with the uneven part 32al formed on the upper face of the arm part 32a, so that it is possible to stop the coupling part 32b on which the cable clamp 33 for fixing the cable 34 is provided, at the optimum position.

Figure 7A:
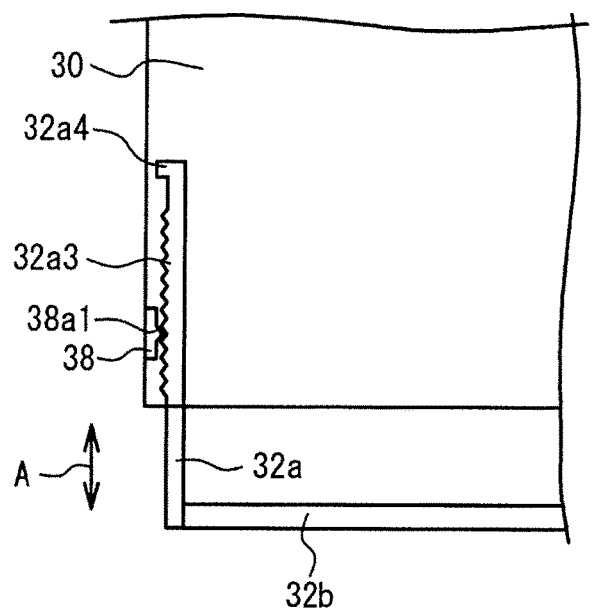
FIGS. 7A and 7B are diagrams illustrating variations of the sliding mechanism of the cable stay.
Figure 7B:
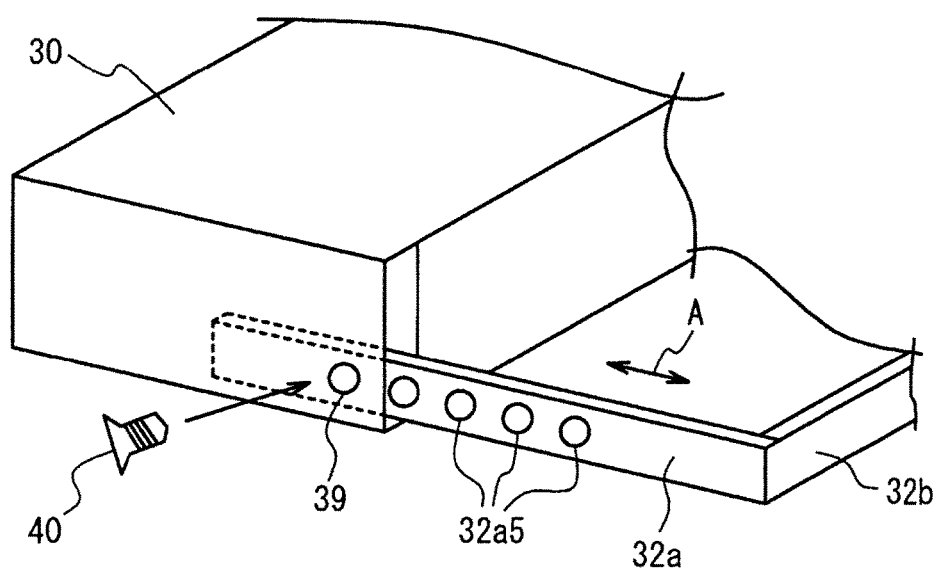

FIGS. 7A and 7B are diagrams illustrating variations of the sliding mechanism of the cable stay 32. FIG. 7A illustrates a part of the body part 30 and the cable stay 32 seen from above. FIG. 7B illustrates the part of the body part 30 and the cable stay 32 seen from a diagonal front side.

As illustrated in FIG. 7A, the sliding mechanism of the cable stay 32 includes the arm parts 32a of the cable stay 32 and a damper 38 (a moving stopper). The damper 38 is provided on a side face of the body part 30, and is made of an elastic member (e.g. a plate spring) having a projection 38al. An uneven part 32a3 which engages with the projection 38al of the damper 38 is formed on a side face of the arm part 32a of the cable stay 32. Moreover, a stopper 32a4 which stops drawing out the cable stay 32 by contacting the damper 38 is formed at the rear end of the arm part 32a of the cable stay 32. The cable stay 32 slides in the depth direction (the A-direction). The damper 38 engages with the uneven part 32a3 formed on the side face of the arm part 32a, so that it is possible to stop the cable stay 32 at the optimum position.

As illustrated in FIG. 7B, the sliding mechanism of the cable stay 32 includes the arm parts 32a of the cable stay 32 and a through-hole (a first through-hole) 39 formed on the side face of the body part 30. In the case of FIG. 7B, a plurality of screw holes 32a5 are formed on the side face of the arm part 32a of the cable stay 32 at equal intervals. The cable stay 32 slides in the depth direction (the A-direction). A screw 40 is fastened into one of the screw holes 32a5 through the through-hole 39, so that it is possible to stop the cable stay 32 at the optimum position.

Figure 8A:
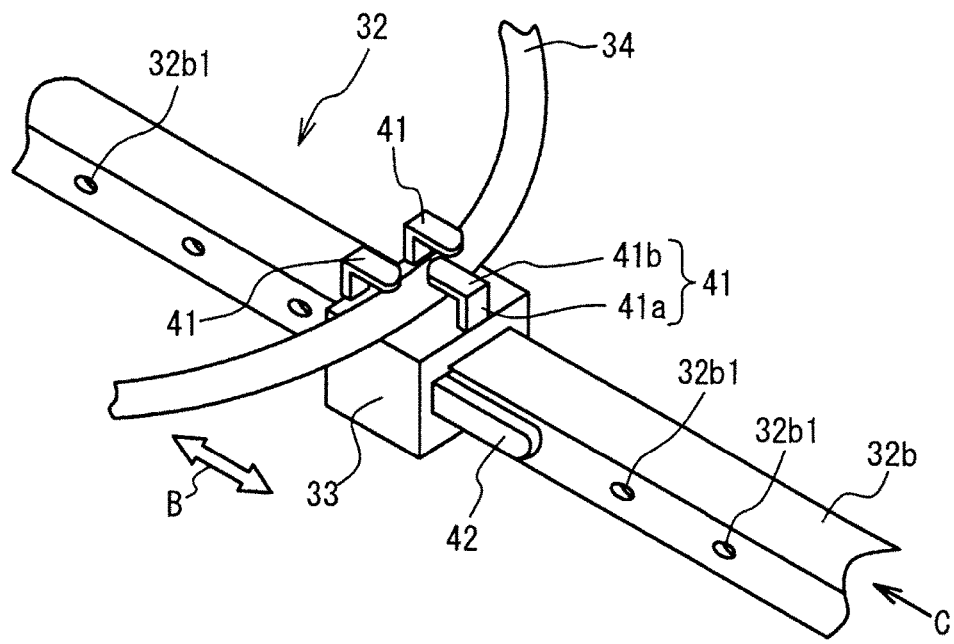
FIG. 8A is a diagram illustrating the configuration of a cable clamp.
Figure 8B:
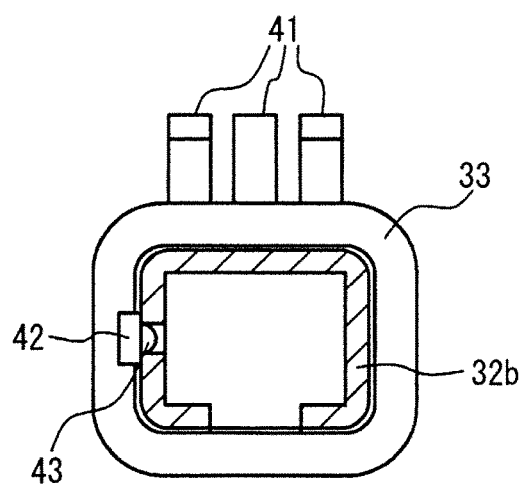
FIG. 8B is a cross-sectional view of the cable clamp and the cable stay seen from a C-direction of FIG. 8A.

FIG. 8A is a diagram illustrating the configuration of the cable clamp. FIG. 8B is a cross-sectional view of the cable clamp and the cable stay seen from a C-direction of FIG. 8A.

The cable clamp 33 is made of a resin, for example. A plurality of hook parts 41 for fixing the cable 34 are formed on an upper face of the cable clamp 33. Each of the hook parts 41 has an inverted L-shape in a side view, and includes a vertical part 41a that extends vertically from the upper face of the cable clamp 33 and a horizontal part 41b that extends horizontally from a top end of the vertical part 41a. When the cable 34 is fixed, the hook parts 41 are bent and the cable 34 is sandwiched between the horizontal part 41b of the hook part 41 and the upper face of the cable clamp 33.

Moreover, a plurality of through-holes (second through-holes) 32b1 are formed on the side face (e.g. a face opposite to the switch unit 31) of the coupling part 32b of the cable stay 32 at equal intervals. The cable clamp 33 includes an arm part 42 (a second arm part) extending along the side face of the coupling part 32b of the cable stay 32, and a projection 43 (see FIG. 8B) is formed on a tip of the arm part 42. The projection 43 engages with the through-hole 32b1 on the side face of the coupling part 32b, and the cable clamp 33 is fixed at a predetermined position of the coupling part 32b. Moreover, when the arm part 42 is bent and the projection 43 is removed from the through-hole 32b1, the cable clamp 33 is slidable in a B-direction (i.e., a horizontal direction) of FIG. 8A.

Thus, the cable 34 is sandwiched by the hook parts 41 of the cable clamp 33 mounted on the cable stay 32, which prevents the hanging-down of the cable 34. Moreover, the cable clamp 33 is slidable over the cable stay 32 to adjust an extra length of the cable 34. Since the plurality of through-holes 32b1 with which the projection 43 of the cable clamp 33 engages are formed on the coupling part 32b of the cable stay 32, it is possible to stop the cable clamp 33 at any position in order to adjust the extra length of the cable 34.

According to the first embodiment, the body part 30 includes the cable clamp 33 that holds the cable 34 and is movable in the horizontal direction, and the cable stay 32 that is equipped with the cable clamp 33 and is movable in the depth direction of the body part 30. Therefore, it is possible to eliminate the hanging-down of the cable 34.

Second Embodiment

The second embodiment explains a case where the console drawer and the KVM switch are housed in the server rack.

Figure 9:
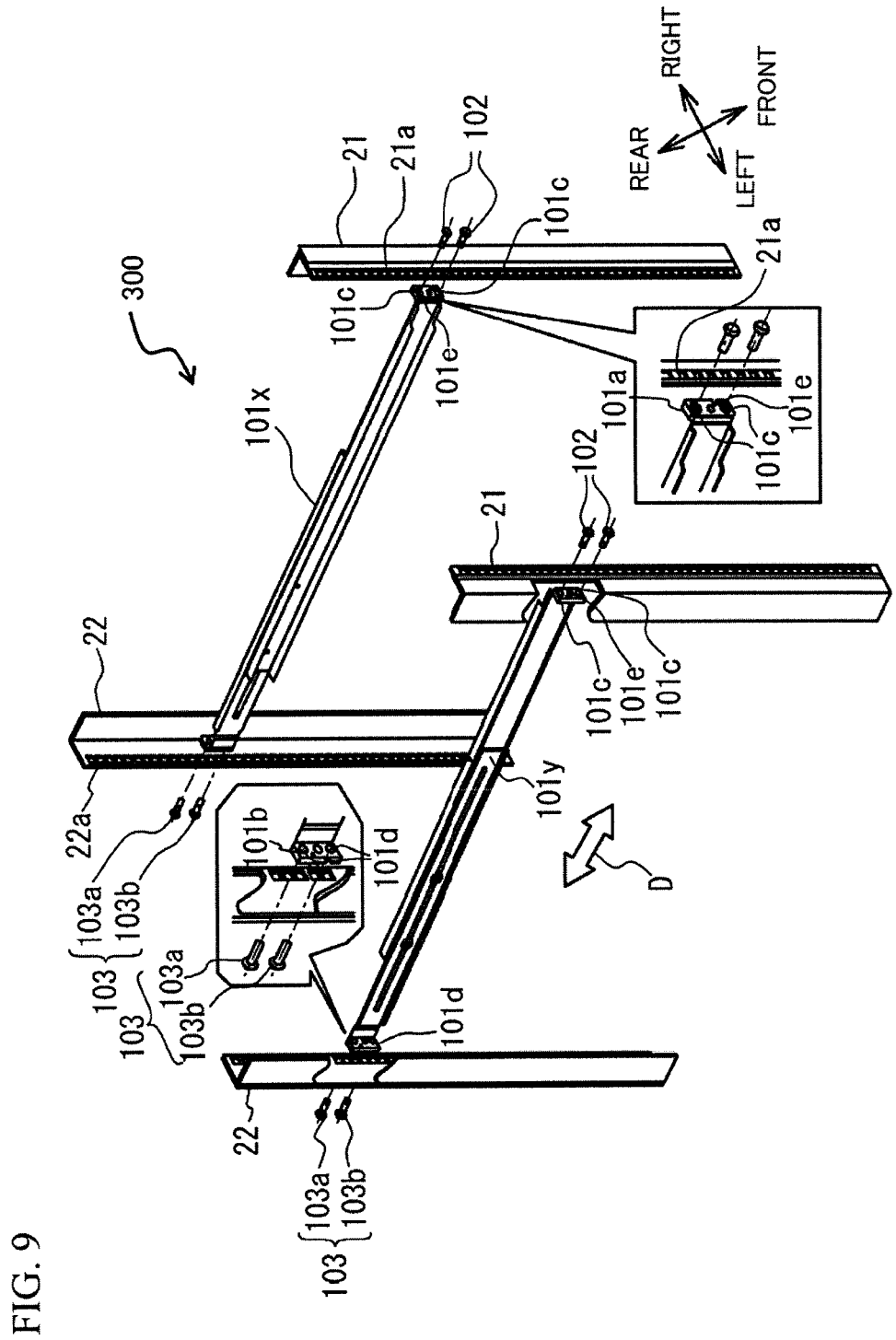
FIG. 9 is a diagram illustrating the configuration of the front support posts and the rear support posts of the server rack and guide rails according to a second embodiment.

FIG. 9 is a diagram illustrating the configuration of the front support posts and the rear support posts of the server rack and the guide rails.

The server rack 300 includes two front support posts 21 and two rear support posts 22. A plurality of through-holes 21a for mounting members are vertically formed on each of the front support posts 21 at equal intervals. Similarly, a plurality of through-holes 22a for mounting members are vertically formed on each of the rear support posts 22 at equal intervals. The guide rails 101 includes a right guide rail 101x and a left guide rail 101y. Hereinafter, a configuration common to the right guide rail 101x and the left guide rail 101y is explained as the guide rail 101.

Each guide rail 101 is fixed between the single front support post 21 and the single rear support post 22. The guide rail 101 is formed so that two rails are overlapped, and is extendable in a D-direction (i.e., a depth direction) of FIG. 9. A mounting part 101a opposite to the front support post 21 and perpendicular to the depth direction is formed on a front end of the guide rail 101. A mounting part 101b opposite to the rear support post 22 and perpendicular to the depth direction is formed on a rear end of the guide rail 101.

The mounting part 101a includes two screw holes 101c arranged vertically to fix the guide rail 101 to the front support post 21 with two screws 102. Moreover, the mounting part 101a includes a screw hole 101e between the two screw holes 101c. The screw hole 101e is used when a console drawer 110 mentioned later (see FIG. 10) is screwed to the front support post 21.

The mounting part 101b includes three screw holes 101d arranged vertically to fix the guide rail 101 to the rear support post 22 with two screws 103 (an upper screw 103a and a lower screw 103b). Here, when the guide rail 101 is fixed to the rear support post 22, an upper and a lower screw holes 101d are used, and a middle screw hole 101d is not used.

Moreover, the guide rail 101 in which a temporary-fixing pin (not shown) is inserted beforehand into the middle screw hole 101d can be used as a variation of the guide rail 101. In this case, the guide rail 101 can be temporarily fixed to the rear support post 22 by pushing the temporarily-fixing pin into the through-hole 22a of the rear support post 22.

Figure 10:
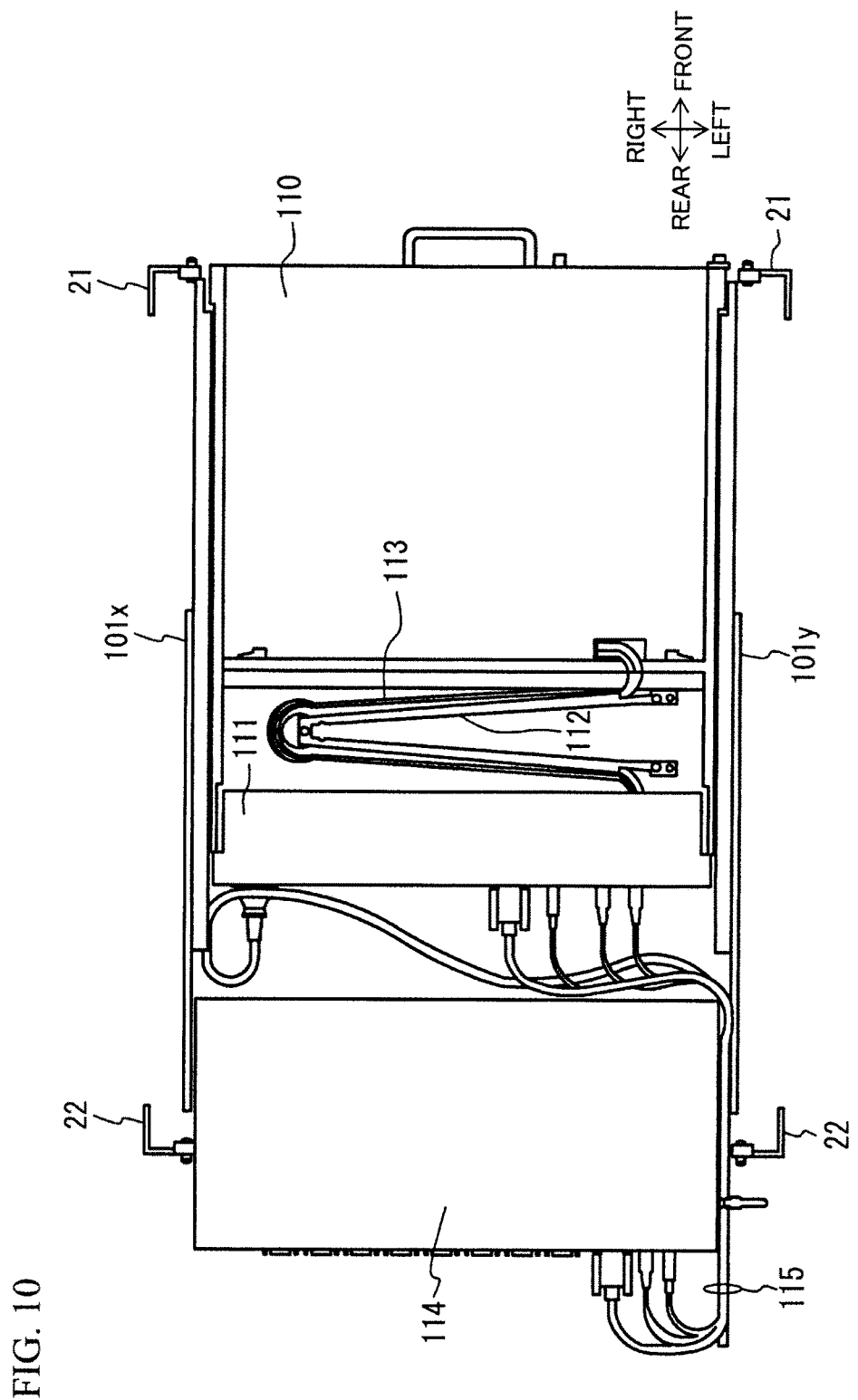
FIG. 10 is a diagram illustrating the configuration of the console drawer and the KVM switch to be housed in the server rack.

FIG. 10 is a diagram illustrating the configuration of the console drawer and the KVM switch to be housed in the server rack. The console drawer and the KVM switch are a device of 1 U (unit).

In FIG. 10, the console drawer 110 is a drawer-type console unit which unified a keyboard, a mouse and a monitor. The console drawer 110 is used for operating a sever device, not shown, mounted on the server rack. The console drawer 110 is mounted on the server rack via the pair of guide rails 101 (the right guide rail 101x and the left guide rail 101y). The console drawer 110 is slidably engaged with and held by the pair of guide rails 101.

A cable group 113 composed of a plurality of cables is connected to a rear face side of the console drawer 110. The cable group 113 is connected to a repeater 111. A cable group 115 composed of a plurality of cables is connected between a rear face side of a KVM switch 114 and the repeater 111. Moreover, a carrier 112 for holding the cable group 113 is coupled with the rear face side of the console drawer 110. The carrier 112 is extendable depending on the movement of the console drawer 110.

The console drawer 110 is mounted at the same height as the KVM switch 114. The KVM switch 114 is mounted on the rear face side of the console drawer 110. The KVM switch 114 is fixed to the rear support post 22 with the use of a rack mount panel 120 mentioned later. The console drawer 110 is electrically connected to the KVM switch 114 via the cable group 113, the repeater 111 and the cable group 115.

Figure 11A:
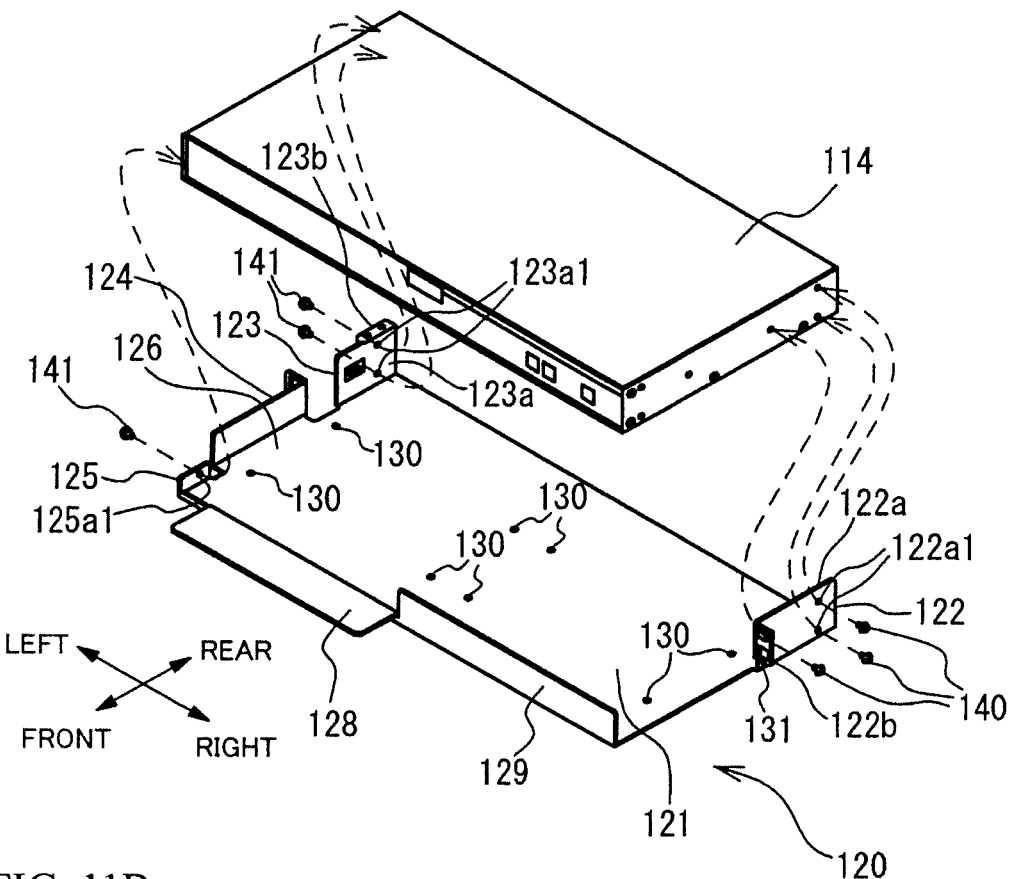
FIG. 11A is a diagram illustrating the schematic configuration of a rack mount panel that is mounted on the KVM switch and mounts the KVM switch on the rack.
Figure 11B:
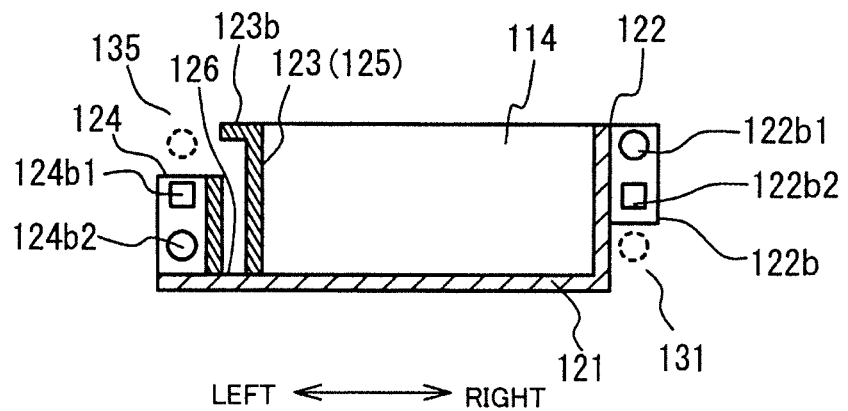
FIG. 11B is a front view of the rack mount panel seen from the front.
Figure 12A:
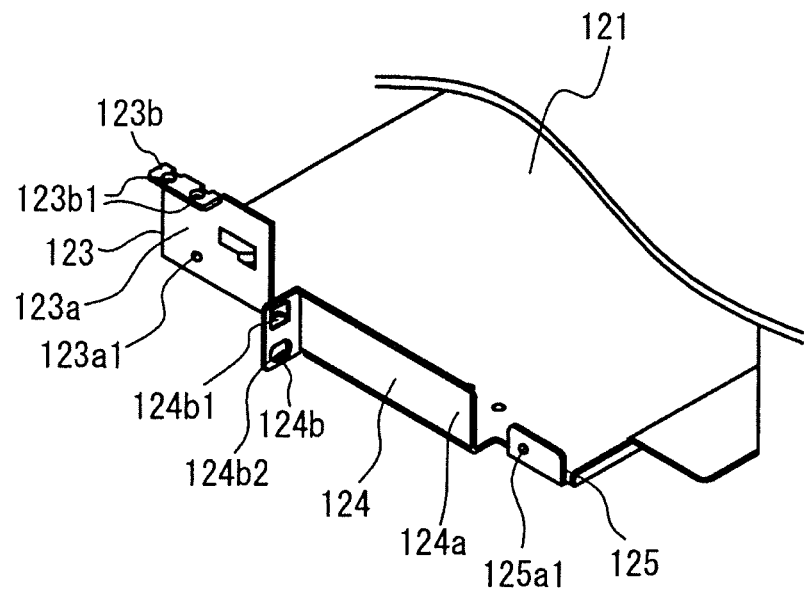
FIG. 12A is an enlarged perspective view illustrating a left side face of the rack mount panel.
Figure 12B:
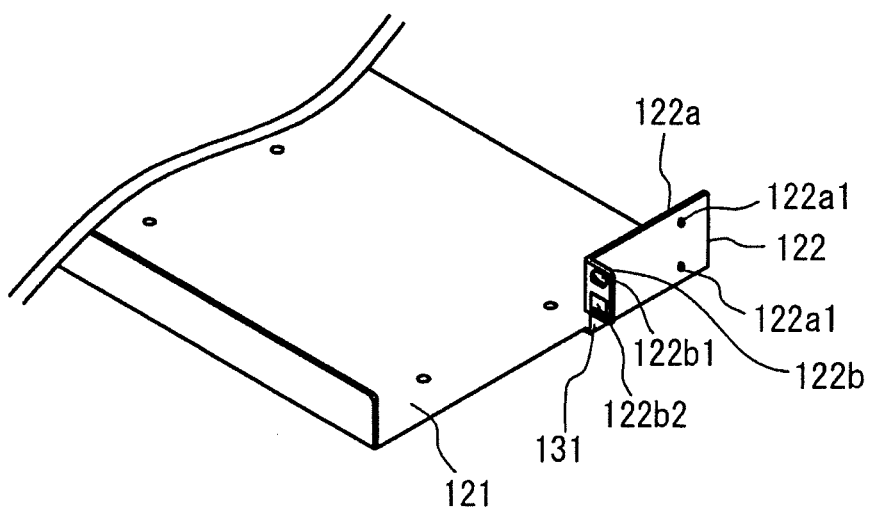
FIG. 12B is an enlarged perspective view illustrating a right side face of the rack mount panel.

FIG. 11A is a diagram illustrating the schematic configuration of the rack mount panel 120 that is mounted on the KVM switch 114 and mounts the KVM switch on the rack. FIG. 11B is a front view of the rack mount panel 120 seen from the front. FIG. 12A is an enlarged perspective view illustrating a left side face of the rack mount panel 120. FIG. 12B is an enlarged perspective view illustrating a right side face of the rack mount panel 120.

As illustrated in FIG. 11A, the rack mount panel 120 includes: a bottom face 121 (a bottom part) that mounts the KVM switch 114; a right side face 122 (a right mounting part) that is stood vertically from a right end of the bottom face 121 or in parallel with a right side face of the KVM switch 114; a first left side face 123 (a side face mounting part), a second left side face 124 (a left mounting part) and a third left side face 125 that are stood vertically from a left end of the bottom face 121 or in parallel with a left side face of the KVM switch 114; a front face 129 that is stood vertically from a front end of the bottom face 121; and a protrusive face 128 that is adjacent to the front face 129 and forward protrudes in parallel with the bottom face 121. The rack mount panel 120 may be formed by performing press processing on one piece of metal plate. A plurality of screw holes 130 for screwing the KVM switch 114 are provided on the bottom face 121.

As illustrated in FIGS. 11A, 11B and 12B, the right side face 122 includes: a first mounting part 122a that is mounted on the right side face of the KVM switch 114; and a second mounting part 122b that is bent at 90 degrees from the first mounting part 122a, is extended rightward, and is mounted on the rear support post 22.

The first mounting part 122a includes a plurality of screw holes 122a1 for fastening the right side face 122 to the right side face of the KVM switch 114 with screws 140. The second mounting part 122b includes: a screw hole 122b1 for fastening itself to the right guide rail 101x via the through-hole 22a of the rear support post 22; and a hole 122b2 for fixing a temporary-fixing pin 160 (see FIGS. 14A and 14B) provided in the middle screw hole 101d of the mounting part 101b of the right guide rail 101x. Here, the second mounting part 122b does not need to include the hole 122b2 depending on a guide rail to be used.

The height of the first mounting part 122a corresponds to the height of three through-holes 22a vertically arranged on the rear support post 22. The height of the second mounting part 122b corresponds to the height of two through-holes 22a vertically arranged on the rear support post 22. That is, three holes corresponding to the three through-holes 22a vertically arranged on the rear support post 22 are not formed on the second mounting part 122b. The second mounting part 122b includes screw hole 122b1 and the hole 122b2 corresponding to the two through-holes 22a, and a cutout 131 (a first cutout) is formed at a position corresponding to the through-hole 22a located immediately below the through-hole 22a corresponding to the hole 122b2 (see FIGS. 11B and 12B).

The second mounting part 122b is fastened to the rear support post 22 and the mounting part 101b (see FIG. 9) of the right guide rail 101x with the upper screw 103a. In this case, the position of the screw hole 122b1 corresponds to the position of the screw hole 101d formed at the uppermost position of the mounting part 101b of the right guide rail 101x, and the position of the cutout 131 corresponds to the position of the screw hole 101d formed at the lowest position of the mounting part 101b of the right guide rail 101x. Therefore, the position of the cutout 131 corresponds to the position of the through-hole 22a lower by two steps than the through-hole 22a to which the screw hole 101d formed at the uppermost position is screwed.

As illustrated in FIGS. 11A and 12A, the first left side face 123 includes: a first mounting part 123a that is mounted on the left side face of the KVM switch 114; and a second mounting part 123b that is bent at 90 degrees from the upper end of the first mounting part 123a, is horizontally extended leftward, and on which a cable cover 150 (an upper cover) mentioned later for avoiding the cable group 115 from protruding toward an upper device in the server rack is mounted.

The first mounting part 123a includes a plurality of screw holes 123a1 for fastening the left side face 123 to the left side face of the KVM switch 114 with screws 141. The second mounting part 123b includes a plurality of screw holes 123b1 for mounting the cable cover 150.

Figure 13A:
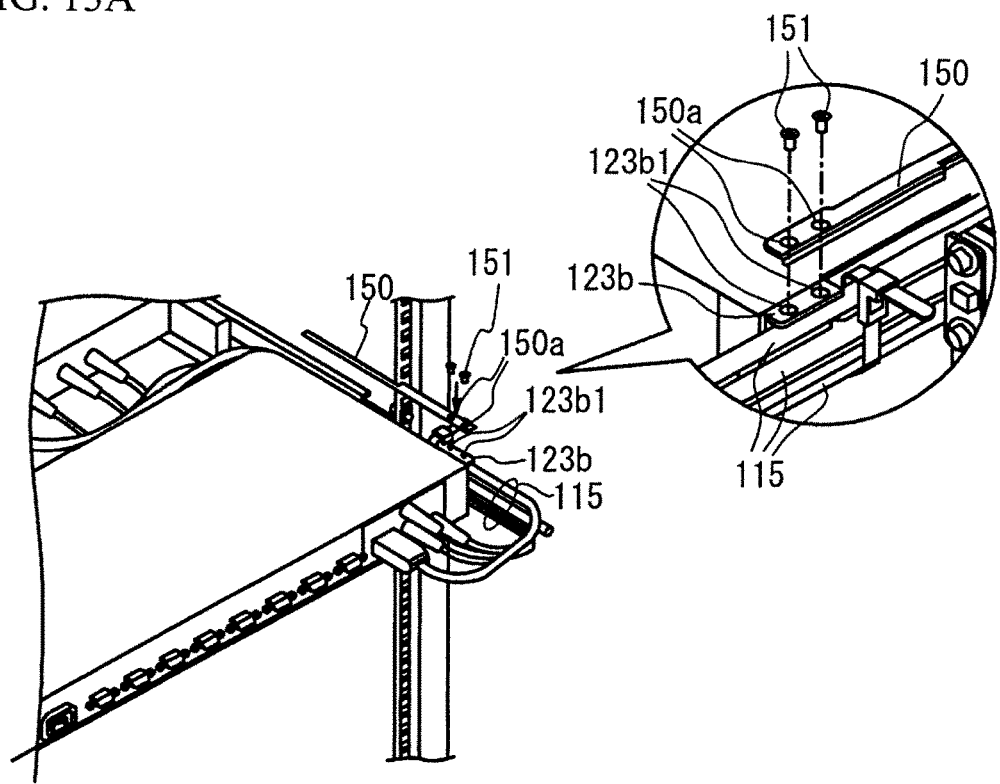
FIG. 13A is a diagram illustrating a state where a cable cover is mounted on a second mounting part of a first left side face.
Figure 13B:
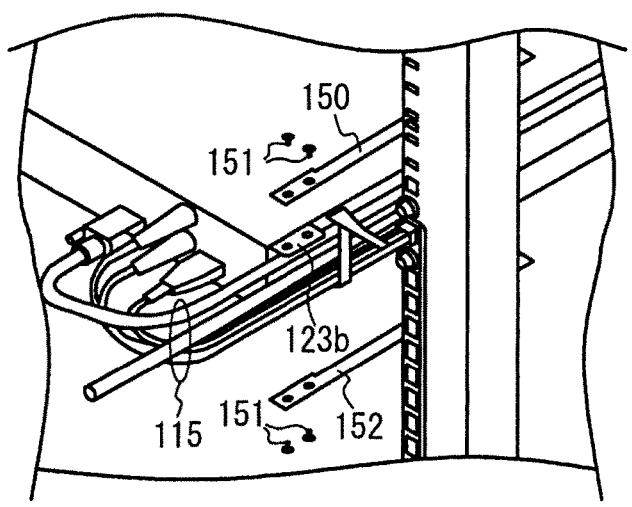
FIG. 13B is a diagram illustrating a state where two cable cover are mounted on the first left side face.

FIG. 13A is a diagram illustrating a state where the cable cover 150 is mounted on the second mounting part 123b of the first left side face 123. The cable cover 150 is a rod-like member and includes screw holes 150a for mounting it on the second mounting part 123b. By fastening screws 151 to the screw holes 123b1 via the screw holes 150a, the cable cover 150 is mounted on the second mounting part 123b. The cable cover 150 prevents the cable group 115 from getting into an upper side of a place where the KVM switch 114 is installed. FIG. 13B is a diagram illustrating a state where two cable cover are mounted on the first left side face 123. In this case, a third mounting part, not shown, opposite to the second mounting part 123b is formed at the bottom of the first left side face 123. Then, as with FIG. 13A, the cable cover 150 is mounted on the second mounting part 123b. A cable cover 152 is mounted on the third mounting part with screws 151. Thus, providing the cable covers 150 and 152 above and below the cable group 115 may prevent the cable group 115 from getting into the upper and the lower sides of the place where the KVM switch 114 is installed.

Returning to FIGS. 11A and 12A, the third left side face 125 is stood vertically from the left end of the bottom face 121, and includes a screw hole 125a1 for fastening itself to the left side face of the KVM switch 114 with the screw 141.

As illustrated in FIGS. 11A and 11B, the second left side face 124 is provided so as to project leftward from the first left side face 123 and the third left side face 125. As illustrated in FIG. 11B, a cable arrangement domain 126 for arranging the cable group 115 is formed between the second left side face 124, and the first left side face 123 and the third left side face 125. The cable group 115 connected to the repeater 111 is drawn out to the rear face side of the KVM switch 114 through the cable arrangement domain 126. The cable arrangement domain 126 is a part of the bottom face 121, and hence prevents the cable group 115 from getting into the lower side of the place where the KVM switch 114 is installed.

As illustrated in FIG. 12A, the second left side face 124 includes a wall part 124a that is stood vertically from the left end of the bottom face 121; and a mounting part 124b that is bent at 90 degrees from the wall part 124a, is extended leftward, and is mounted on the rear support post 22. The mounting part 124b includes: a hole 124b1 for fixing the temporary-fixing pin 160 (see FIGS. 14A and 14B) provided in the middle screw hole 101d of the mounting part 101b of the right guide rail 101x; and a screw hole 124b2 for fastening itself to the left guide rail 101y via the through-hole 22a of the rear support post 22. Here, the mounting part 124b does not need to include the hole 124b1.

The height of the mounting part 124b corresponds to the height of the two through-holes 22a vertically arranged on the rear support post 22. The mounting part 124b is formed lower than the second mounting part 122b by the height of one through-holes 22a (see FIG. 11B). That is, the height of the hole 124b1 is the same as that of the hole 122b2, and the height of the screw hole 124b2 is the same as that of the cutout 131. Moreover, a cutout 135 (a second cutout) is formed at a height corresponding to the screw hole 122b1 of the mounting part 124b (see FIG. 11B).

The mounting part 124b is fastened to the rear support post 22 and the mounting part 101b (see FIG. 9) of the left guide rail 101y with the lower screw 103b. In this case, the position of the screw hole 124b2 corresponds to the position of the screw hole 101d formed at the lowest position of the mounting part 101b of the left guide rail 101y. The position of the cutout 135 corresponds to the position of the screw hole 101d formed at the uppermost position of the mounting part 101b of the left guide rail 101y. That is, the position of the cutout 135 corresponds to the position of the through-hole 22a higher by two steps than the through-hole 22a to which the screw hole 124b2 is screwed.

Figure 14A:
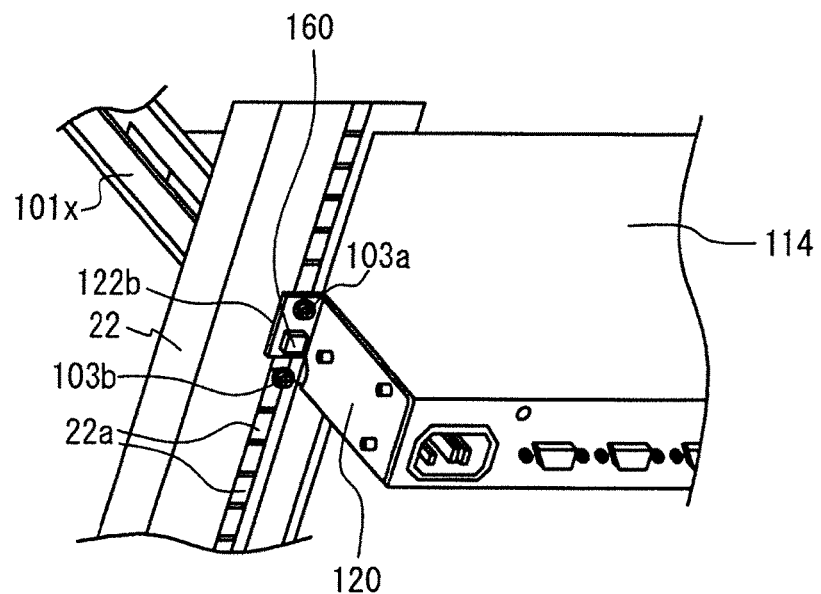
FIG. 14A is a diagram illustrating a state where a second mounting part of a right side face is fixed to a right rear support post with an upper screw.
Figure 14B:
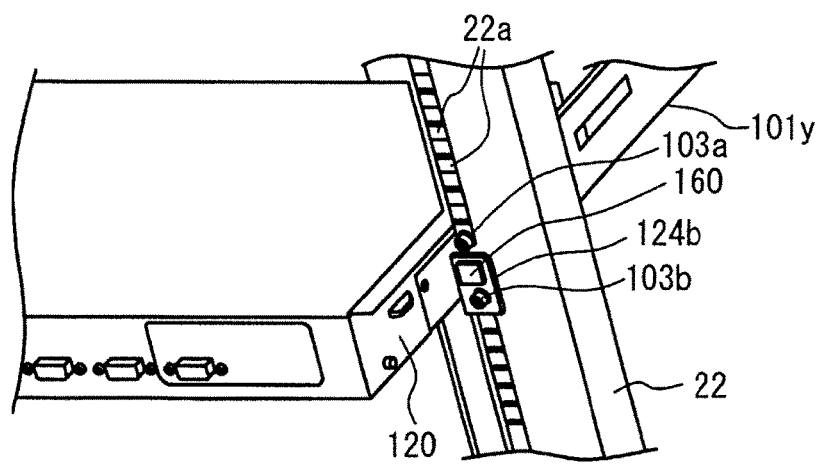
FIG. 14B is a diagram illustrating a state where a mounting part of a second left side face is fixed to a left rear support post with a lower screw.

FIG. 14A is a diagram illustrating a state where the second mounting part 122b of the right side face 122 is fixed to the right rear support post 22 with the upper screw 103a. FIG. 14B is a diagram illustrating a state where the mounting part 124b of the second left side face 124 is fixed to the left rear support post 22 with the lower screw 103b.

As illustrated in FIG. 14A, the second mounting part 122b is fixed to the right rear support post 22 with the upper screw 103a. At this time, the upper screw 103a is fastened to the screw hole 101d formed at the uppermost position of the mounting part 101b of the right guide rail 101x through the through-hole 22a of the right rear support post 22, and hence the right guide rail 101x is fixed to the right rear support post 22. Moreover, as illustrated in FIG. 14B, the mounting part 124b is fixed to the left rear support post 22 with the lower screw 103b. At this time, the lower screw 103b is fastened to the screw hole 101d formed at the lowest position of the mounting part 101b of the left guide rail 101y through the through-hole 22a of the left rear support post 22, and hence the left guide rail 101y is fixed to the left rear support post 22.

In FIG. 14A, the lower screw 103b is used for fixing the mounting part 101b (not shown) of the right guide rail 101x to the right rear support post 22, and is not used for fixing the second mounting part 122b to the right rear support post 22. Similarly, in FIG. 14B, the upper screw 103a is used for fixing the mounting part 101b (not shown) of the left guide rail 101y to the left rear support post 22, and is not used for fixing the mounting part 124b to the left rear support post 22.

Thus, in the rack mount panel 120, the arrangement of the lower screw 103b for fixing the mounting part 124b to the left rear support post 22 and the arrangement of the upper screw 103a for fixing the second mounting part 122b to the right rear support post 22 can be made different in right and left. That is, the arrangement of the screws 103 (the upper screw 103a and the lower screw 103b) for fixing the KVM switch 114 to the right and left rear support posts 22 can be made different in right and left. As a result, when the KVM switch 114 is mounted on the server rack, a strength of the mounting can be improved.

Figure 15:
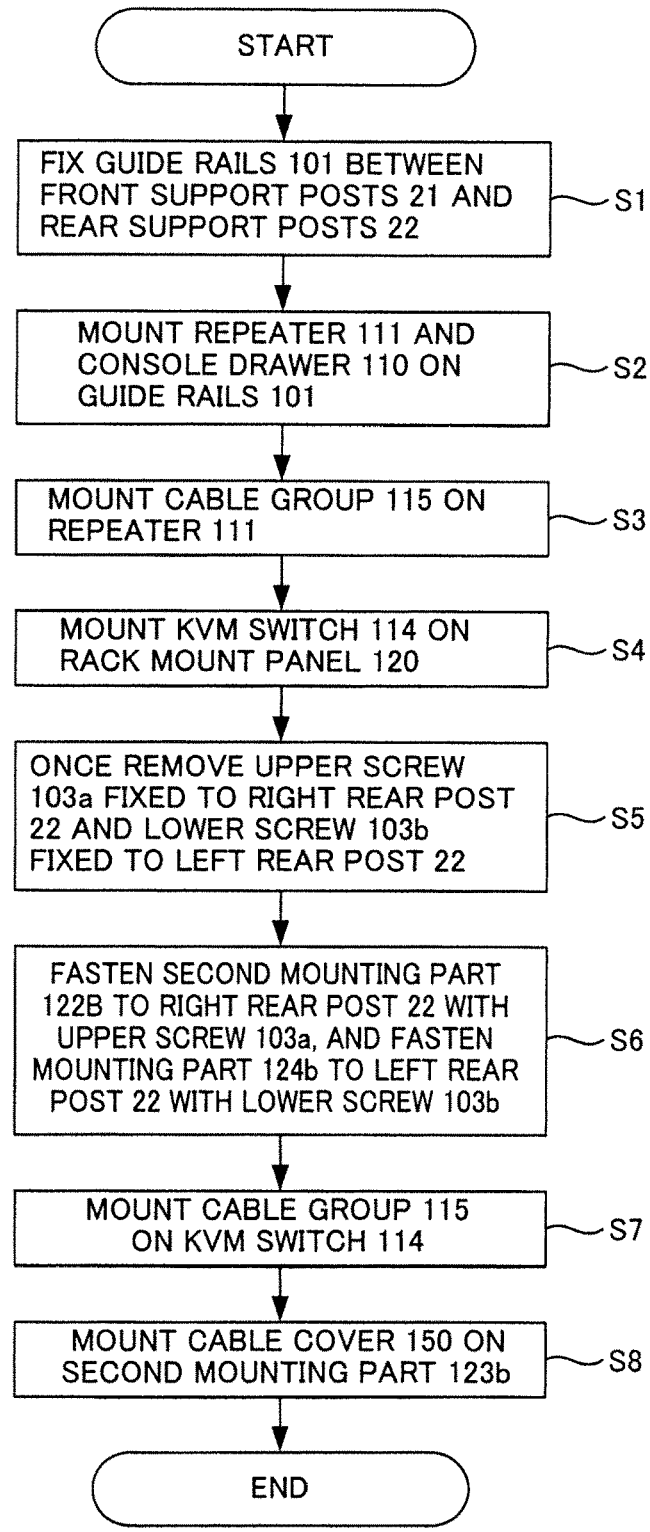
FIG. 15 is a flowchart illustrating a method of mounting the console drawer and the KVM switch on the server rack.

FIG. 15 is a flowchart illustrating a method of mounting the console drawer 110 and the KVM switch 114 on the server rack.

First, a worker fixes the guide rails 101 (the right guide rail 101x and the left guide rail 101y) to the front support posts 21 and the rear support posts 22 with the screws 102 and 103 (step S1).

Then, the worker mounts the repeater 111 and the console drawer 110 on the guide rails 101 (step S2). At this time, the worker carries out work while supporting the console drawer 110. Here, the carrier 112 and the cable group 113 are mounted beforehand between the repeater 111 and the console drawer 110.

Next, the worker mounts the cable group 115 on the repeater 111 (step S3). Then, the worker mounts the KVM switch 114 on the rack mount panel 120 (step S4).

When the rack mount panel 120 on which the KVM switch 114 is mounted is fixed to the rear support posts 22, the worker once removes the upper screw 103a that fixes the guide rail to the right rear support post 22 illustrated in FIG. 14A and the lower screw 103b that fixes the guide rail to the left rear support post 22 illustrated in FIG. 14B (step S5). At this time, the right guide rail 101x illustrated in FIG. 14A is fixed with the lower screw 103b, the left guide rail 101y illustrated in FIG. 14B is fixed with the upper screw 103a, and therefore another worker does not need to support the console drawer 110 and the guide rails 101.

Then, while supporting the rack mount panel 120 on which the KVM switch 114 is mounted, the worker fastens the second mounting part 122b to the right rear support post 22 with the upper screw 103a as illustrated in FIG. 14A, and fastens the mounting part 124b to the left rear support post 22 with the lower screw 103b as illustrated in FIG. 14B (step S6). At this time, the upper screw 103a which fastens the second mounting part 122b to the right rear support post 22 fastens the mounting part 101b of the right guide rail 101x to the right rear support post 22 at the same time. That is, the upper screw 103a fastens the second mounting part 122b and the mounting part 101b of the right guide rail 101x to the right rear support post 22 together. Moreover, the lower screw 103b which fastens the mounting part 124b to the left rear support post 22 fastens the mounting part 101b of the left guide rail 101y to the left rear support post 22 at the same time. That is, the lower screw 103b fastens the mounting part 124b and the mounting part 101b of the left guide rail 101y to the left rear support post 22 together. Therefore, the single worker can mount two or more members (the console drawer and the KVM switch or the server) on the server rack.

Then, the worker mounts the cable group 115 on the KVM switch 114 (step S7), and mounts the cable cover 150 on the second mounting part 123b (step S8). The present process is terminated.

Figure 16A:
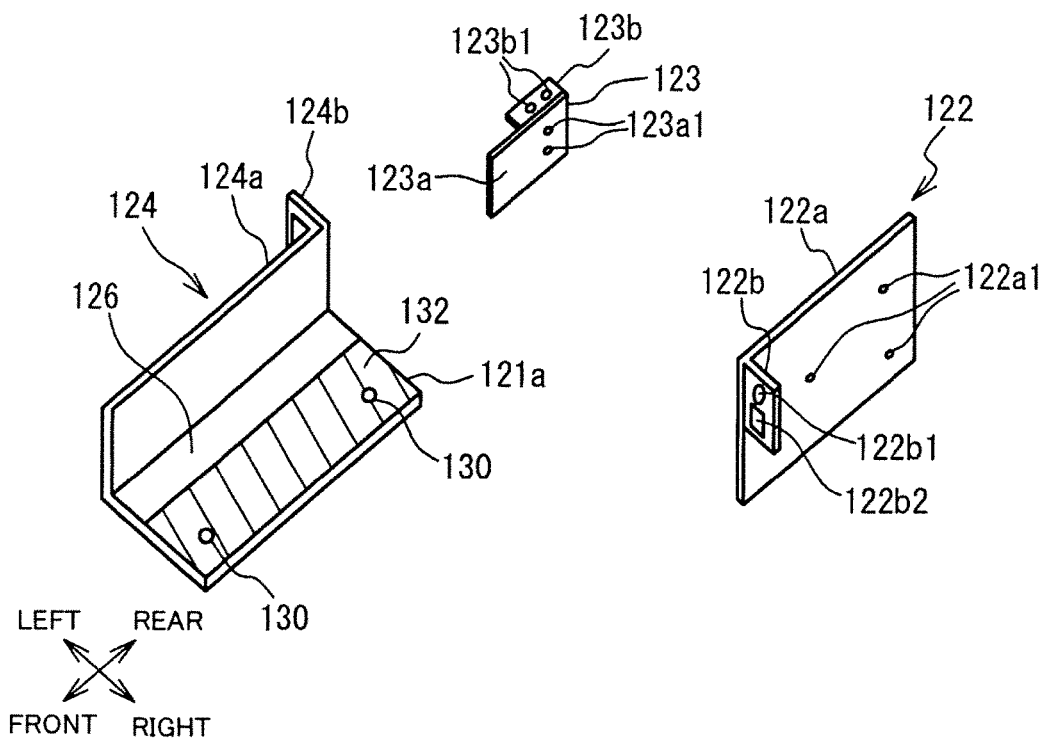
FIG. 16A is a diagram illustrating the configuration of a right side face, a first left side face and a second left side face as independent mounting brackets.
Figure 16B:
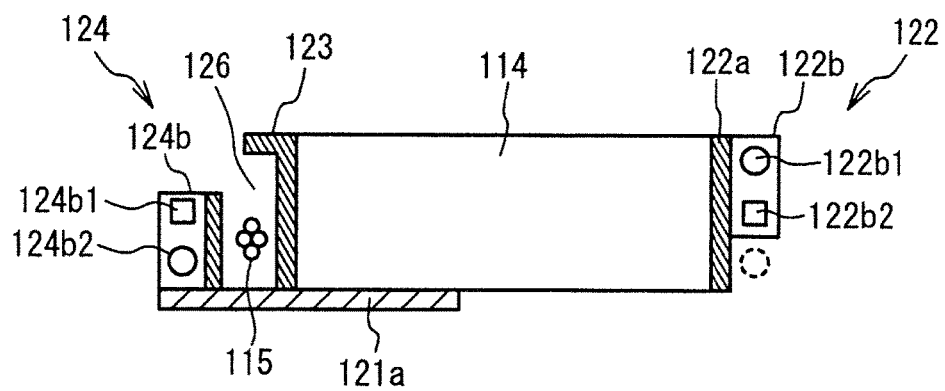
FIG. 16B is a diagram illustrating a state where the KVM switch on which the right side face, the first left side face and the second left side face as the independent mounting brackets are mounted is seen from the front.

In the second embodiment, the KVM switch 114 is mounted on the rack mount panel 120 illustrated in FIG. 11A made of one sheet metal. However, the right side face 122, the first left side face 123 and the second left side face 124 of the rack mount panel 120 may be configured as the independent mounting brackets as illustrated in FIGS. 16A and 16B, for example. FIG. 16A is a diagram illustrating the configuration of the right side face 122, the first left side face 123 and the second left side face 124 as the independent mounting brackets. FIG. 16B is a diagram illustrating a state where the KVM switch 114 on which the right side face 122, the first left side face 123 and the second left side face 124 as the independent mounting brackets are mounted is seen from the front.

The right side face 122 of FIG. 16A is the independent mounting bracket, and is therefore different from the right side face 122 of FIG. 11A in that it is not stood from the bottom face 121 of the rack mount panel 120. With respect to other elements except the above-mentioned element, the right side face 122 of FIG. 16A is the same as the right side face 122 of FIG. 11A, and hence a description thereof is omitted.

The first left side face 123 of FIG. 16A is also the independent mounting bracket, and is therefore different from the first left side face 123 of FIG. 11A in that it is not stood from the bottom face 121 of the rack mount panel 120. With respect to other elements except the above-mentioned element, the first left side face 123 of FIG. 16A is the same as the first left side face 123 of FIG. 11A, and hence a description thereof is omitted.

The second left side face 124 of FIG. 16A is stood from the bottom face 121a, and this bracket is formed in an L-shape in a front view. A hatched line portion 132 of FIG. 16A is a domain where the KVM switch 114 is mounted. Screw holes 130 for screwing the KVM switch 114 are formed on the hatched line portion 132. The bottom face 121a is overlapped with a part of the bottom face of the KVM switch 114, as illustrated in FIG. 16B. The cable arrangement domain 126 on which the cable group 115 is arranged is formed between the wall part 124a and the hatched line portion 132 of the second left side face 124. With respect to other elements except the above-mentioned element, the second left side face 124 of FIG. 16A is the same as the second left side face 124 of FIG. 11A, and hence a description thereof is omitted.

In the second embodiment, the description is given of a case where the console drawer 110 and the KVM switch 114 are housed in the server rack. However, other devices may be housed in the server rack. For example, the console drawer 110 and the server, not shown, may be housed in the server rack. In this case, when the server is mounted on the rack, the rack mount panel 120 or the above-mentioned mounting brackets (i.e., the right side face 122, the first left side face 123 and the second left side face 124 of FIG. 16A) can be employed.

Figure 17:
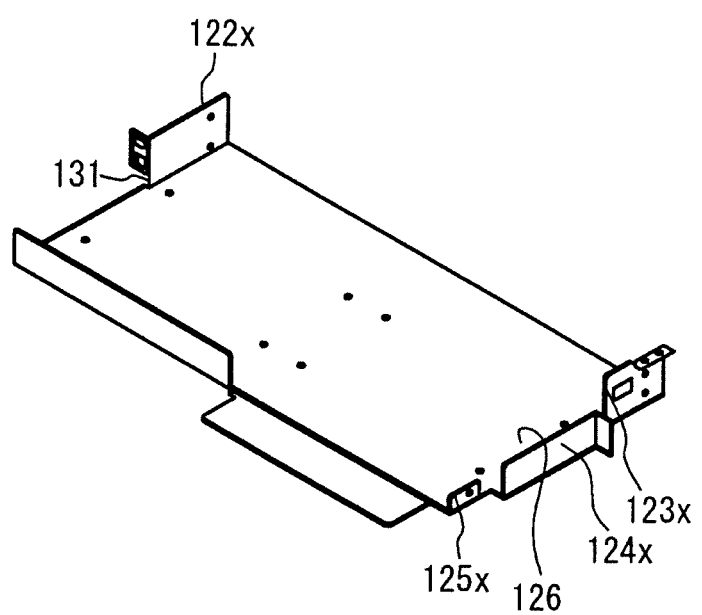
FIG. 17 is a diagram illustrating a variation of the rack mount panel.

Moreover, in the rack mount panel 120 of FIG. 11A, the right side face 122 is formed at the right side, and the first left side face 123, the second left side face 124 and the third left side face 125 are formed at the left side. For example, as illustrated in FIG. 17, a first right side face 123x, a second right side face 124x and a third right side face 125x having the same functions as the first left side face 123, the second left side face 124 and the third left side face 125 may be formed at the right side of the rack mount panel 120, and a left side face 122x having the same function as the right side face 122 may be formed at the left side. In this case, the cable arrangement domain 126 is formed between the right side face of the KVM switch 114 and the second right side face 124x. Moreover, each of the first right side face 123x, the second right side face 124x and the left side face 122x may be the independent mounting bracket, as with FIG. 16A.

According to the second embodiment, the second mounting part 122b of the right side face 122 is fastened to the right rear support post 22 along with the right guide rail 101x with the use of the upper screw 103a, and the mounting part 124b of the second left side face 124 is fastened to the left rear support post 22 along with the left guide rail 101y with the use of the lower screw 103b. Then, the cutouts (131 and 135) are configured so that the second mounting part 122b of the right side face 122 does not contact the lower screw 103b which fastens the right guide rail 101x to the right rear support post 22, and the mounting part 124b of the second left side face 124 does not contact the upper screw 103a which fastens the left guide rail 101y to the left rear support post 22.

Therefore, the right guide rail 101x is fixed by the lower screw 103b, the left guide rail 101y is fixed by the upper screw 103a, and these screws does not need to be removed when the KVM switch 114 is mounted on the rear support posts 22. Therefore, when the KVM switch 114 is mounted on the right and left rear support posts 22, the worker does not need to support the console drawer 110 and the guide rails 101. Moreover, when the KVM switch 114 is mounted on the right and left rear support posts 22, the lower screw 103b which fastens the right guide rail 101x to the right rear support post 22 and the upper screw 103a which fastens the left guide rail 101y to the left rear support post 22 do not interfere with the mounting of the KVM switch 114. Therefore, the single worker can mount two or more members (the console drawer and the KVM switch or the server) on the server rack.

Some preferred embodiments of the present invention have been described in detail, but the present invention is not limited to these specifically described embodiments but may have various variations and alterations within the scope of the claimed invention.

The invention claimed is:

1. A mounting bracket for mounting a second device electrically connected to a first device on right and left support posts of a rack along with right and left guide rails on which the first device is mounted, the mounting bracket comprising:
    a right mounting part that includes a first screw hole, is fastened to the right support post along with the right guide rail via the first screw hole with the use of a first screw, and has a shape not to contact a third screw that fastens the right guide rail to the right support post; and
    a left mounting part that includes a second screw hole, is fastened to the left support post along with the left guide rail via the second screw hole with the use of a second screw, and has a shape not to contact a fourth screw that fastens the left guide rail to the left support post.

2. The mounting bracket according to claim 1, wherein a height of the first screw hole and a height of the second screw hole are different from each other.

3. The mounting bracket according to claim 1,
wherein one of the right mounting part and the left mounting part is screwed to a side face of the second device, and another of the right mounting part and the left mounting part is opposite to another side face of the second device via a cable arrangement domain which arranges a cable connected between the first device and the second device, and
wherein the mounting bracket includes a side face mounting part screwed to the another side face of the second device, and an upper cover that is fixed to the side face mounting part and covers the cable from above.

4. The mounting bracket according to claim 1, wherein the right mounting part and the left mounting part are configured as independent separate brackets.

5. The mounting bracket according to claim 1, further comprising:
a bottom part on which the second device is mounted;
wherein the right mounting part extends from a right end of the bottom part and the left mounting part extends from a left end of the bottom part.

6. A system, comprising:
a rack;
a pair of guide rails that are screwed to a front face and a rear face of the rack with a plurality of screws;
an electronic device mounted on the front face and the rear face of the rack;
a mounting bracket that mounts the electronic device on the rack;
wherein the mounting bracket includes:
a first mounting part that includes a first screw hole for screwing the electronic device to one of a right side and a left side of the rack with a first screw, and a first cutout that is formed at a position of a second screw fixing one of the guide rails to the one of the right side and the left side of the rack;
a second mounting part that includes a second screw hole for screwing the electronic device to another of the right side and the left side of the rack with a third screw, and a second cutout that is formed at the position of the second screw fixing the another of the guide rails to another of the right side and the left side of the rack;
wherein the electronic device is fixed to the rack along with the guide rails with the first screws and the third screws.

* * * * *